United States Patent [19]

Ogata et al.

[11] Patent Number: 5,291,039
[45] Date of Patent: Mar. 1, 1994

[54] LED HEAD HAVING HEAT RADIATING MOUNT

[75] Inventors: Hiromi Ogata; Seiji Koshikawa; Hideharu Hamada, all of Kyoto, Japan

[73] Assignee: Rohm Co., Ltd., Kyoto, Japan

[21] Appl. No.: 953,114

[22] Filed: Sep. 29, 1992

[30] Foreign Application Priority Data

Sep. 30, 1991 [JP] Japan ................... 3-250039

[51] Int. Cl.⁵ .......................................... H01L 33/00
[52] U.S. Cl. .................................... 257/99; 257/98; 257/712; 362/800
[58] Field of Search ............... 257/81, 98, 99, 712, 257/731; 362/800, 368, 373; 313/500

[56] References Cited

U.S. PATENT DOCUMENTS

| | | | |
|---|---|---|---|
| 4,915,470 | 4/1990 | Moore et al. | 257/98 |
| 4,959,761 | 9/1990 | Critelli et al. | 257/99 |
| 5,014,074 | 5/1991 | Dody et al. | 257/99 |

FOREIGN PATENT DOCUMENTS

| | | | |
|---|---|---|---|
| 60-192376 | 9/1985 | Japan | 257/98 |
| 62-46578 | 2/1987 | Japan | 257/98 |
| 3-180081 | 8/1991 | Japan | 257/99 |

OTHER PUBLICATIONS

Heidrich et al., "LED Array Print Head configuration", IBM Technical Disclosure Bulletin, vol. 25, No. 7A, Dec. 1982.

*Primary Examiner*—Rolf Hille
*Assistant Examiner*—Minhloan Tran
*Attorney, Agent, or Firm*—Fish & Richardson

[57] ABSTRACT

An LED head includes a circuit substrate on which a light emitting element and drive IC are mounted, a SELFOC lens for condensing the irradiating light from the light emitting element on the circuit substrate, and a head cover of aluminum for holding the SELFOC lens spaced a given distance away from the light emitting element and for radiating heat from the circuit substrate.

5 Claims, 4 Drawing Sheets

LED HEAD HAVING HEAT RADIATING MOUNT

BACKGROUND OF THE INVENTION

1. Field of the Invention

The present invention relates to an LED head suitable for use in LED printers and particularly to such an LED comprising an integrated combination of heat radiating plate and head cover.

2. Description of the Related Art

The LED head is used to focus and image irradiating light from an array of light emitting elements onto a photosensitive drum, the irradiating light being condensed by an array of lenses. One of the conventional LED heads is shown in FIGS. 5A and 5B.

Referring to FIGS. 5A and 5B, the prior art LED head 20 comprises a circuit substrate 21 on which a light emitting element and drive IC are mounted; an array of lenses 22 for condensing the irradiating light from the light emitting element; a head cover 23 supporting the circuit substrate 21 on its underside and also supporting the lens array 22 spaced above the light emitting element and a given distance apart; and a heat radiating plate 24 fixedly secured on the underside of the circuit substrate 21 and adapted to radiate heat from the circuit substrate 21.

The circuit substrate 21, head cover 23 and heat radiating plate 24 are placed one on top of another and are firmly held in place by a mounting spring 25, as shown in FIG. 5B. The LED head includes three of such mounting springs 25 which are spaced away from one another in the longitudinal direction of the LED head.

The head cover 23 includes a reference pin $23_{-1}$ downwardly extending from the bottom face thereof while the circuit substrate 21 includes a through-hole $21_{-1}$ formed therethrough. By inserting the reference pin $23_{-1}$ into the through-hole $21_{-1}$, the lens array 22 can be properly positioned relative to the circuit substrate 21.

As described hereinbefore, the LED head includes a separate heat radiating plate 24 for radiating heat from the circuit substrate 21, in addition to the circuit substrate 21, lens array 22 and head cover 23.

Therefore, the number of parts is increased by the heat radiating plate, resulting in an increase of the manufacturing cost. Furthermore, the heat radiating plate contributes to increase the overall weight of the LED head.

SUMMARY OF THE INVENTION

Figure 1:
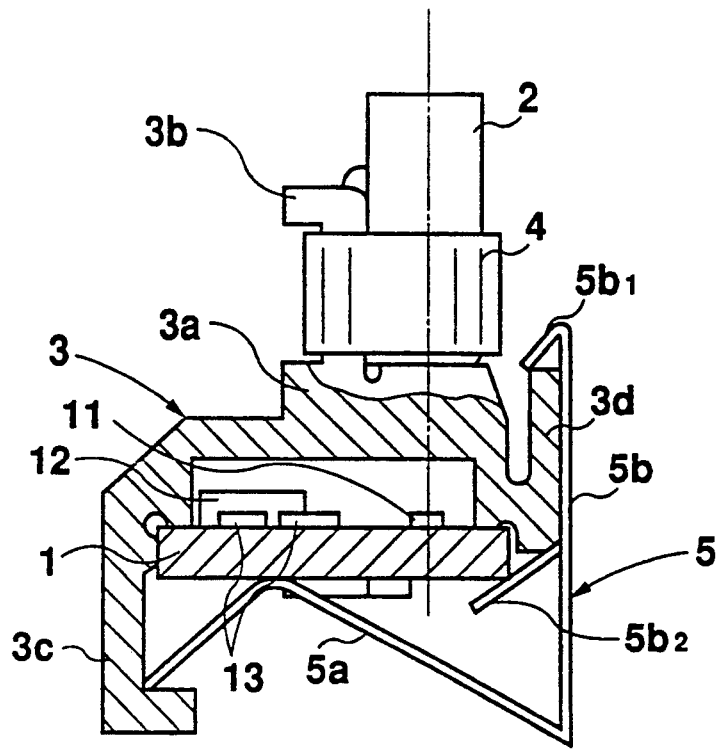
FIG. 1 is a side view of one embodiment of an LED head constructed in accordance with the present invention.

It is therefore an object of the present invention to provide an improved LED head having a lighter and less expensive structure.

To this end, the present invention provides an LED head comprising a circuit substrate on which a light emitting element and drive IC are mounted; an array of lenses for condensing the irradiating light from the light emitting element; and a metallic head cover for holding the lens array spaced away from the light emitting element by a given distance and for radiating heat from the circuit substrate.

The circuit substrate and metallic head cover are firmly held together by mounting means. The mounting means includes a plurality of mounting members, each of which is of a resilient material having a substantially V-shaped cross-section. The mounting member engages, at one end, the bottom face of the circuit substrate to urge it against the head cover. The one end of the mounting member is further turned to form an extension which engages a portion of the head cover extending downwardly from one end beyond the circuit substrate. The other end of the V-shaped mounting member engages another portion of the head cover extending upwardly from the other end thereof. In such a manner, the circuit substrate and head cover can be firmly held together.

Each of the mounting members includes an engagement piece stamped into the side of that mounting member. The engagement piece engages at least a part of one side of the circuit substrate adjacent to the bottom thereof such that the circuit substrate and head cover can be more reliably held together.

The mounting members are made of a metal material.

The circuit substrate generates heat at all times when the LED head is being actuated since the circuit substrate includes the light emitting element, drive IC and others therein.

The lens array condenses and images the light irradiated from the light emitting element on the circuit substrate onto the photosensitive drum.

The head cover is formed of a metal material having a good heat conductivity. The head cover supports the lens array and circuit substrate and positions the light emitting element and lens array at their positions spaced away from each other. The head cover further serves as a radiator for radiating heat from the circuit substrate. Therefore, any other heat radiating means is not required in the LED head of the present invention.

In addition, the metallic mounting members serve to radiate heat from the circuit substrate.

The present invention is characterized by the use of the head cover which is formed of a metal material having a superior heat conductivity. Such a metal material may be any suitable metal including aluminum or the like as long as it fulfills the purpose of the present invention.

Although some embodiments of the present invention will be described by way of example with reference to the drawings, it is to be understood that the present invention may be applied to all integrated combinations of the head cover with the heat radiating plate.

Referring first to FIG. 1, there is shown one embodiment of an LED head constructed in accordance with the present invention. The LED head comprises a circuit substrate 1 on which a light emitting element and drive IC are mounted, a SELFOC lens 2 for condensing the irradiating light from the light emitting element on the circuit substrate 1, and a head cover 3 of aluminum for holding the SELFOC lens 2 spaced a given distance away from the light emitting element and for radiating heat from the circuit substrate 1. The lens array 2 and head cover 3 are held in place together by a lens holder 4 while the head cover 3 and circuit substrate 1 are held together by mounting springs 5.

On the circuit substrate 1, there is mounted an LED element 11 which is arranged to have its optical axis common to that of the SELFOC lens 2. The circuit substrate 1 further supports a drive element 12 and resistance element 13 all of which function to drive the LED element 11. These three elements generate heat when they are energized. The circuit substrate 1 is heated by such heat.

The head cover 3 comprises a horizontal section 3a including an elongated slot (not shown) formed therein at the central position and adapted to receive the SELFOC lens 2 at the top of the head cover 3; a first vertical section 3b extending upwardly from the horizontal section 3a and having its outer end turned outwardly at right angles; a second vertical section 3c extending downwardly from the horizontal section 3a and having its outer end turned inwardly; and a third vertical section 3d extending upwardly from the horizontal section 3a at the other end.

The SELFOC lens 2 is fixedly held against the first vertical section 3b of the head cover 3 through the lens holder 4.

Each mounting spring 5 is of a substantially V-shaped cross-section comprising two parts 5a and 5b. One of these spring parts 5a is of a substantially inverted V-shaped cross-section while the other spring part 5b includes a tip turned portion $5b_1$ and a stamped portion $5b_2$. Preferably, the mounting spring 5 is formed of a metal material.

The circuit substrate 1 is mounted on the underside of the head cover 3 through the mounting springs 5. More particularly, the outer end of the spring part 5a in each mounting spring 5 is caused to engage the inside of the inwardly turned portion of the vertical section 3c in the head cover 3 while the inverted V-shaped spring portion of the same spring part 5a is caused to engage the bottom face of the circuit substrate 1 to urge it upwardly. The tip turned end $5b_1$ of the spring part 5b is then caused to engage the top end of the third vertical section 3d while the stamped portion $5b_2$ of the same spring part 5b is caused to engage the circuit substrate 1 to urge it laterally. Thus, the circuit substrate 1 can be properly positioned in all the lateral directions.

Figure 2A:
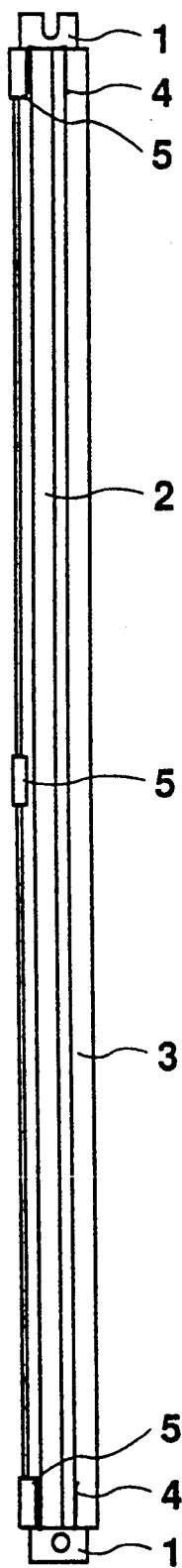
FIGS. 2A, 2B and 2C are respectively a plan view, front view and bottom view of the LED head shown in FIG. 1.
Figure 2B:
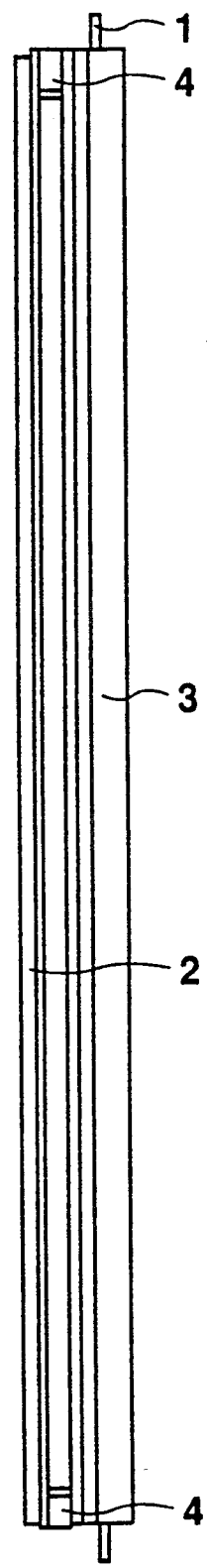
Figure 2C:
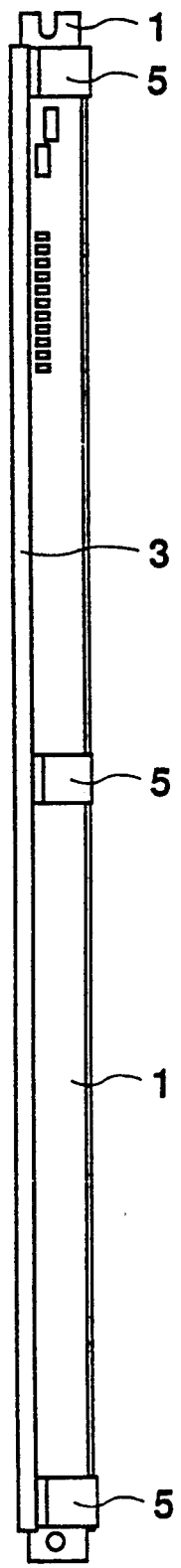

FIG. 2 shows the LED head shown in FIG. 1: FIG. 2A is a plan view of the LED head; FIG. 2B is a front elevational view of the same LED head and FIG. 2C is a bottom view of the same LED head. As will be apparent from these figures, the SELFOC lens 2 and head cover 3 of aluminum are firmly held together by the lens holder 4 (FIGS. 2A and 2B) while the head cover 3 is also firmly held against the circuit substrate 1 through the mounting springs 5 (FIG. 2C).

Figure 3:
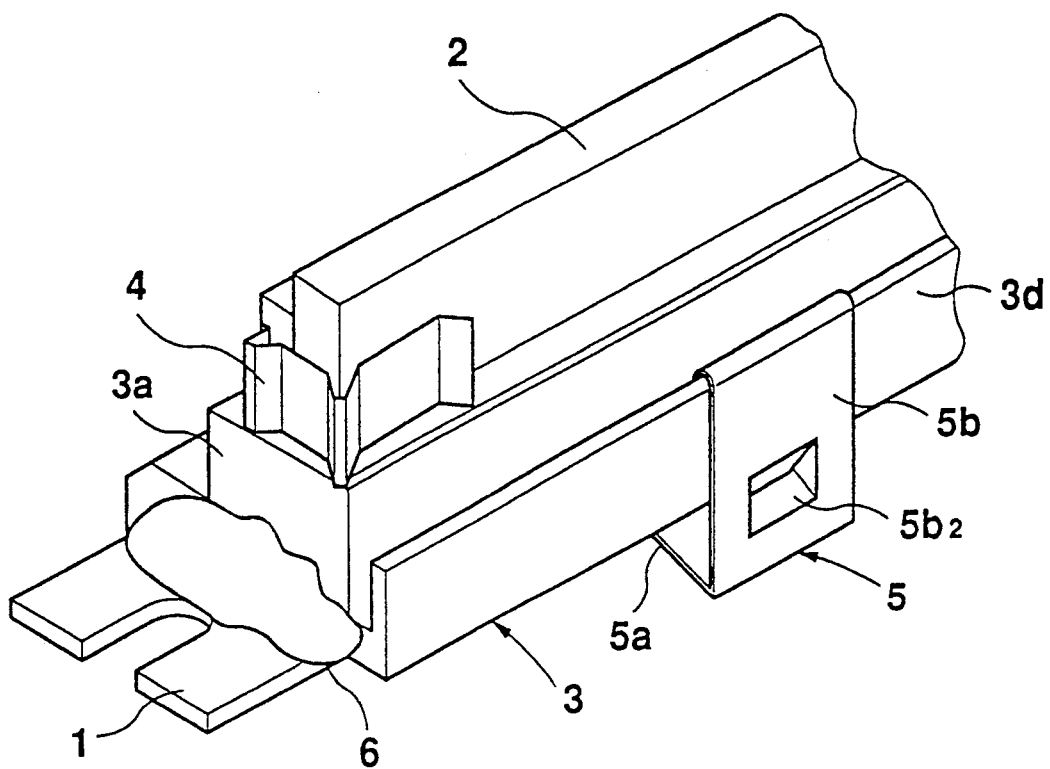
FIG. 3 is a perspective view of the LED head shown in FIG. 1.
Figure 5A:
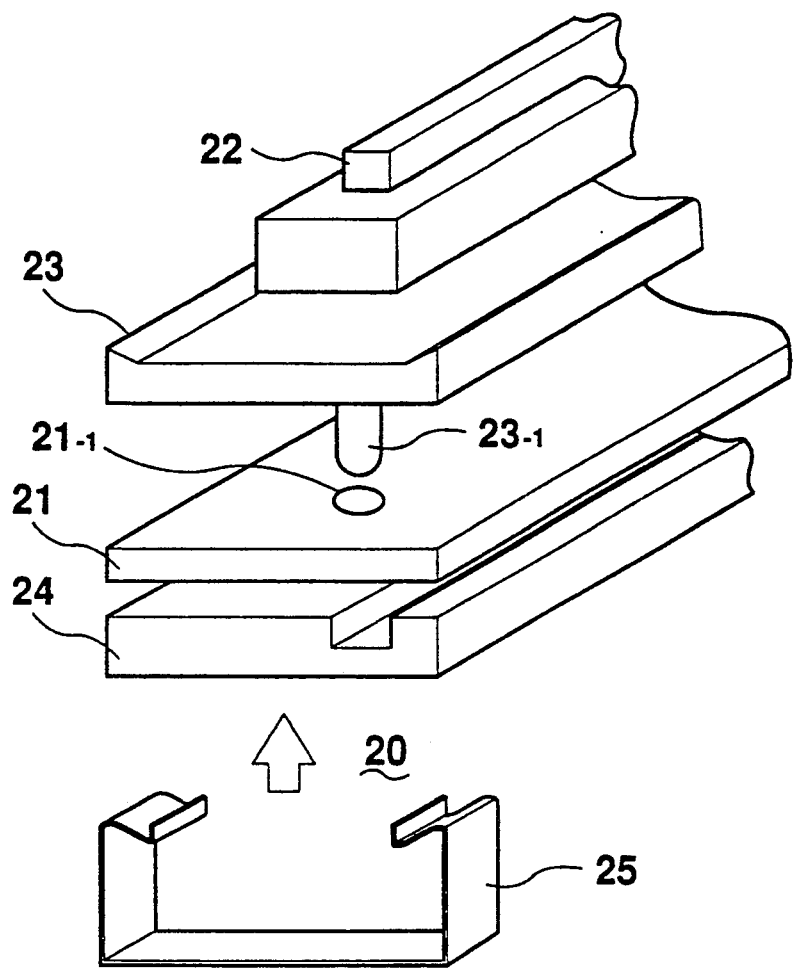
FIGS. 5A and 5B illustrate an example of an LED head constructed in accordance with the prior art.
Figure 5B:
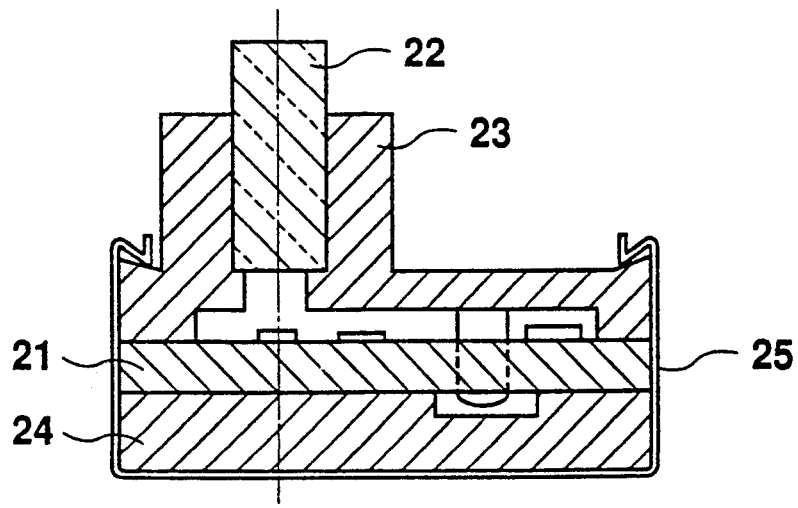

FIG. 3 is a perspective end view of the LED head shown in FIGS. 1 and 2. It will be apparent from FIG. 3 that the lens holder and mounting springs 4, 5 contribute to define an integrated combination of the SELFOC lens 2, head cover 3 and circuit substrate 1. Reference numeral 6 denotes a body of resin material for preventing the circuit elements from being eroded.

Figure 4:
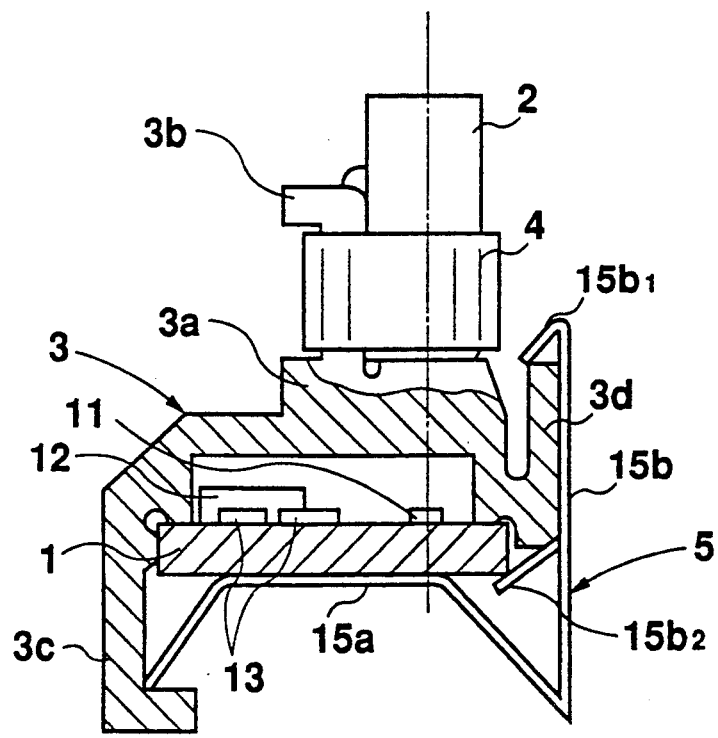
FIG. 4 is a view showing another embodiment of an LED head constructed in accordance with the present invention.

FIG. 4 shows another embodiment of the present invention which utilizes mounting springs 15 having a configuration different from that of the mounting springs 5. The other parts are completely the same as those of the previous embodiment and designated by similar reference numerals, with further description being omitted herein.

Each of the mounting springs 15 includes a portion which is brought into contact with the circuit substrate 1 and which is larger than the corresponding portion of the mounting spring 5 in the previous embodiment. Thus, the mounting springs 15 can radiate more heat from the circuit substrate 1.

We claim:

1. An LED head comprising:
   (a) a circuit substrate on which a light emitting element and drive IC are mounted;
   (b) an array of lenses for condensing light emitted from the light emitting element;
   (c) a metallic head cover which holds the array of lenses spaced a predetermined distance away from the light emitting element, said metallic head cover communicating with the circuit substrate to radiate heat from said circuit substrate; and
   (d) mounting means for firmly holding said circuit substrate and said metallic head cover together.

2. An LED head as defined in claim 1, wherein said circuit substrate has a bottom face, and wherein said mounting means comprises a plurality of mounting members which engage the bottom face of said circuit substrate to bias said circuit substrate against said head cover.

3. An LED head comprising:
   (a) a circuit substrate on which a light emitting element and drive IC are mounted;
   (b) an array of lenses for condensing emitted light from the light emitting element;
   (c) a metallic head cover which holds the array of lenses spaced a predetermined distance away from the light emitting element, said metallic head cover communicating with the circuit substrate to radiate heat from said circuit substrate; and
   (d) mounting means for firmly holding said circuit substrate and said metallic head cover together;
   wherein said circuit substrate has a bottom face, and wherein said mounting means comprises a plurality of mounting members which engage the bottom face of said circuit substrate to bias said circuit substrate against said head cover; and
   wherein each of said mounting members includes a stamped part adapted to engage at least a part of one side of said circuit substrate adjacent to said bottom side.

4. An LED head as defined in claim 3 wherein said metallic head cover comprises:
   (c1) a horizontal section disposed to cover the surface of said circuit substrate;
   (c2) a first vertical section extending upwardly from said horizontal section at one end; and
   (c3) a second vertical section extending downwardly from said horizontal section at the other end, said second vertical section including its L-shaped tip end; and wherein said mounting means is formed of a resilient material having a substantially V-shaped cross-section, said mounting means comprising:
   (d1) an engagement portion which is one leg of the V engaging the bottom face of said circuit substrate;
   (d2) an extension extending from said engagement portion and being adapted to engage said second vertical section; and
   (d3) another engagement portion which is the other leg of the V engaging said first vertical section.

5. An LED head as defined in any one of claims 1, 2, 3, and 4 wherein said mounting means is made of a metal material having a heat radiating property.

* * * * *